(12) United States Patent
Omura et al.

(10) Patent No.: US 7,548,019 B2
(45) Date of Patent: Jun. 16, 2009

(54) ELECTROLUMINESCENCE PANEL

(75) Inventors: Tetsuji Omura, Ogaki (JP); Ryuji Nishikawa, Gifu (JP)

(73) Assignee: Sanyo Electric Co., Ltd. (JP)

( * ) Notice: Subject to any disclaimer, the term of this patent is extended or adjusted under 35 U.S.C. 154(b) by 458 days.

(21) Appl. No.: 11/156,961

(22) Filed: Jun. 20, 2005

(65) Prior Publication Data

US 2005/0280364 A1    Dec. 22, 2005

(30) Foreign Application Priority Data

Jun. 18, 2004    (JP)    ............................. 2004-181850

(51) Int. Cl.
  *H05B 33/04*    (2006.01)
  *H05B 33/10*    (2006.01)
(52) U.S. Cl. ...................................... 313/506; 313/504
(58) Field of Classification Search .................. 313/504, 313/506; 428/690
  See application file for complete search history.

(56) References Cited

U.S. PATENT DOCUMENTS

| | | | |
|---|---|---|---|
| 5,405,710 A | 4/1995 | Dodabalapur et al. | |
| 5,554,911 A | 9/1996 | Nakayama et al. | |
| 5,757,126 A | 5/1998 | Harvey, III et al. | |
| 6,111,270 A | 8/2000 | Xu et al. | |
| 6,366,025 B1 * | 4/2002 | Yamada | 315/169.3 |
| 6,445,005 B1 | 9/2002 | Yamazaki et al. | |
| 6,505,901 B1 | 1/2003 | Fukuda | |
| 6,639,250 B1 | 10/2003 | Shimoda et al. | |
| 6,670,772 B1 | 12/2003 | Arnold et al. | |
| 6,710,541 B2 | 3/2004 | He et al. | |
| 6,737,800 B1 | 5/2004 | Winters et al. | |
| 6,812,637 B2 | 11/2004 | Cok et al. | |
| 6,841,803 B2 | 1/2005 | Aizawa et al. | |
| 6,906,457 B2 | 6/2005 | Song et al. | |
| 2002/0113548 A1 | 8/2002 | Silvernail | |
| 2003/0146696 A1 | 8/2003 | Park et al. | |

(Continued)

FOREIGN PATENT DOCUMENTS

JP    8-8061    1/1996

(Continued)

OTHER PUBLICATIONS

Japanese Laid Opn Publication No. Hei 6-275381 with its English abstract (and corresponding U.S. Patent No. 5,554,911).

(Continued)

*Primary Examiner*—Nimeshkumar D. Patel
*Assistant Examiner*—Anne M Hines
(74) *Attorney, Agent, or Firm*—Cantor Colburn LLP

(57) ABSTRACT

An electroluminescence panel having an electroluminescence element in each pixel, wherein the electroluminescence element comprises an emissive element layer having at least a light emitting function between a reflective film and a semi-transmissive film which is provided opposing the reflective film and have portions having different cavity lengths in one pixel, the cavity length being a distance between the reflective film and the semi-transmissive film. Such a structure can be realized, for example, by changing a thickness of a transparent electrode which is a lower electrode of the element. Because peak wavelength that can be intensified can be varied among regions in one pixel having different cavity lengths, a viewing angle dependency is improved.

8 Claims, 9 Drawing Sheets

U.S. PATENT DOCUMENTS

| | | | |
|---|---|---|---|
| 2003/0160564 | A1 | 8/2003 | Park et al. |
| 2004/0051447 | A1 | 3/2004 | Okinaka et al. |
| 2005/0040756 | A1 | 2/2005 | Winters et al. |
| 2005/0067945 | A1 | 3/2005 | Nishikawa et al. |
| 2005/0067954 | A1 | 3/2005 | Nishikawa et al. |
| 2005/0073228 | A1* | 4/2005 | Tyan et al. .................. 313/110 |
| 2005/0088085 | A1 | 4/2005 | Nishikawa et al. |
| 2005/0099113 | A1 | 5/2005 | Yamada |
| 2005/0225232 | A1* | 10/2005 | Boroson et al. ............. 313/504 |
| 2005/0249972 | A1* | 11/2005 | Hatwar et al. ............... 428/690 |

FOREIGN PATENT DOCUMENTS

WO            00-76010 A1     12/2000

OTHER PUBLICATIONS

"Elements Having Optical Cavity Structure," Molecular Electronics and Bioelectronics in Third Seminar (1993) and partial English translation.
Notice of Grounds for Rejection for Korean Patent Application No. 10-2005-52411 with English translation mailed Oct. 20, 2006.
Office Action for U.S. Appl. No. 10/953,667 mailed Sep. 28, 2007.
Office Action for U.S. Appl. No. 10/952,645 mailed Sep. 21, 2007.
Office Action dated Jan. 6, 2006, for related U.S. Appl. No. 10/954,092 (Our Ref. YKI-0164).
Japanese Patent Laid-Open Publication No. JP2003187975 with its English abstract.
European application No. EP 0615401 dated Sep. 20, 1993.
Partial Translation of Section 3 of Technical Document of Molecular Electronics and Bioelectronics discussed in Third Seminar given in (1993), entitled "elements Having Optical Cavity Structure."
Japanese Laid Opn Publication No. Hei 6-275381 with its English abstract (and corresponding U.S. Patent No. 5,554,911).
"Elements Having Optical Cavity Structure," Molecular Electronics and Bioelectronics in Third Seminar (1993) and partial English translation.
Office Action for U.S. Appl. No. 10/952,645 mailed Apr. 2, 2007.
Office Action for U.S. Appl. No. 10/953,667 mailed Mar. 26, 2007.
Office action dated Jun. 26, 2006 for related U.S. Appl. No. 10/954,092 (Our ref. YKI-0164).
Office Action for corresponding Korean Patent Application No. 10-2004-77132, mailed Apr. 26, 2006, with its excerpt English translation.
Korean Patent Laid-Open Publication No. 2003-2182, dated Jan. 8, 2003, with its English Abstract and complete English translation.
Japanese Patent Laid-Open Publication No. Sho 63-148597, dated Jun. 21, 1988, with its full English translation.
Japanese Patent Laid-Open Publication No. 2001-217072, dated Aug. 10, 2001, with its English Abstract.
Office Action for corresponding Korean Patent Application No. 10-2004-76414, mailed Apr. 25, 2006, with its excerpt English translation.
Office Action for corresponding Korean Patent Application No. 10-2004-76977, mailed Apr. 25, 2005, with its excerpt English translation.
Office Action dated Aug. 3, 2006 for related U.S. Appl. No. 10/953,667 (Our ref. YKI-0165).
Office Action for U.S. Appl. No. 10/952,645 (YKI-0163) mailed Feb. 25, 2008.
United States Office Action for U.S. Appl. No. 10/953,667 mailed May 15, 2008.
Office Action for Application No. 11/362,965; Dated Apr. 6, 2009.

* cited by examiner

ELECTROLUMINESCENCE PANEL

CROSS-REFERENCE TO RELATED APPLICATIONS

The entire disclosure of Japanese Patent Application No. 2004-181850 including specification, claims, drawings, and abstract is incorporated herein by reference.

BACKGROUND OF THE INVENTION

1. Field of the Invention

The present invention relates to an electroluminescence (hereinafter simply referred to as "EL") panel having an EL element in each pixel, and in particular to an EL panel having a micro-resonator (microcavity) in each pixel for intensifying light of a particular wavelength.

2. Description of the Related Art

Recently, flat panel displays (FPD) having thin thickness and a size which can be reduced have attracted much attention. A liquid crystal display device which is a well known example of the FPD is already used in various devices. In addition, much research and development are dedicated to light emitting devices (such as a display device and a light source) which use a self-emissive EL element, and in particular, to organic EL display devices (organic EL panels) which can emit light with various emission colors and at a high luminance depending on the material of the organic compound(s) to be used.

Unlike a method employed in the liquid crystal display devices in which a liquid crystal panel which is provided in front of a backlight as a light valve controls transmittance of light from the backlight, because the organic EL display devices are self-emissive, the organic EL display devices fundamentally have a high usage efficiency of light, that is, a high output efficiency of light to the outside, and thus, the organic EL display devices allow for light emission of high brightness.

In the organic EL element, however, an organic layer is degraded with use, and in particular, there is a problem in that when the current to be applied through the organic layer is increased in order to increase the light emission luminance, degradation of the organic layer is accelerated.

In consideration of this, methods are proposed in which an intensity of light of a particular wavelength is strengthened using a micro-resonator (microcavity) in an EL display device as disclosed in, for example, Japanese Patent Laid-Open Publication No. Hei 6-275381 and Takahiro NAKAYAMA and Atsushi TSUNODA, "Element with a Light Resonator Structure", Japan Society of Applied Physics, Organic Molecular Electronics and Bioelectronics division, Third Convention, 1993, p. 135-p. 143.

When a microcavity is used, however, there is a problem in that a dependence of the display color on the viewing angle (viewing angle dependency) is increased. Specifically, because an optical length of the microcavity when the microcavity is seen from the vertical direction differs from an optical length of the microcavity when the microcavity is seen from a tilted direction, the wavelength of light intensified by the microcavity will differ depending on the angle of view.

Thus, there is a demand to alleviate the viewing angle dependency when a microcavity is used.

SUMMARY OF THE INVENTION

According to one aspect of the present invention, there is provided an electroluminescence panel having an electroluminescence element in each pixel, wherein the electroluminescence element in each pixel has a layered structure with an emissive element layer having at least a light emitting function provided between a reflective film and a semi-transmissive film which opposes the reflective film, the electroluminescence element having a microcavity in which a cavity length which is a distance between the reflective film and the semi-transmissive film is set to intensify light of a predetermined wavelength, and each pixel has portions having different cavity lengths.

According to another aspect of the present invention, it is preferable that, in the electroluminescence panel, the electroluminescence element has an emissive element layer between a transparent electrode and a metal electrode, a semi-transmissive film is provided external to the transparent electrode, and the metal electrode functions as a reflective film, and the microcavity comprises the transparent electrode and the emissive element layer According to another aspect of the present invention, it is preferable that, in the electroluminescence panel, a thickness of the transparent electrode is varied within each pixel to provide the portions having different cavity lengths.

According to another aspect of the present invention, it is preferable that, in the electroluminescence panel, an insulating layer is provided covering a step portion, of the transparent electrode, where the thickness is varied.

According to another aspect of the present invention, it is preferable that, in the electroluminescence panel, a transparent insulating layer is partially provided between the semi-transmissive film and the transparent electrode within one pixel to form the portions having different cavity lengths.

As described, according to the present invention, each pixel has portions of differing cavity lengths, and therefore the viewing angle dependency can be improved.

BRIEF DESCRIPTION OF THE DRAWINGS

A preferred embodiment of the present invention will be described in detail by reference to the drawings, wherein:

FIG. 6 is a diagram showing an example configuration in which the thickness of the transparent electrode is varied;

DESCRIPTION OF THE PREFERRED EMBODIMENT

Figure 1:
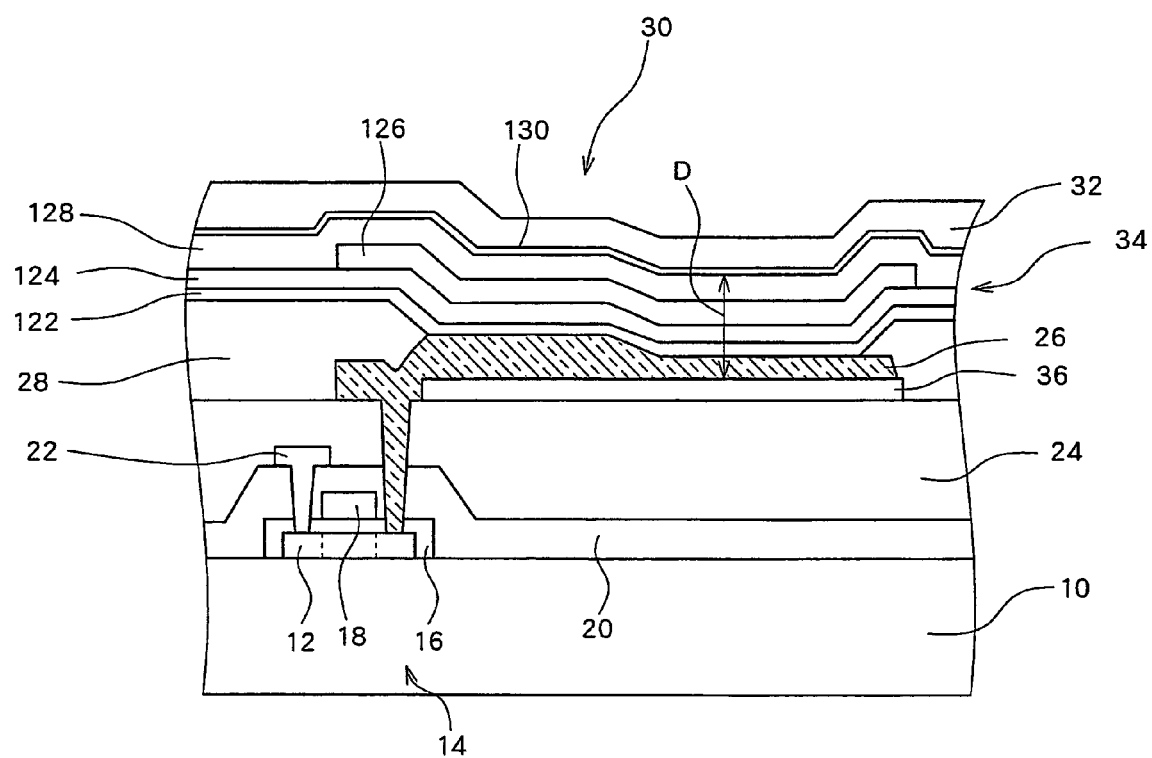
FIG. 1 is a diagram showing essential structures of a pixel according to a preferred embodiment of the present invention.

Preferred embodiments of the present invention will now be described referring to the drawings.

FIG. 1 is a schematic view showing a structure of a portion of a pixel forming a microcavity in a display panel according to a preferred embodiment of the present invention.

A semiconductor layer 12 is formed corresponding to a predetermined location of a glass substrate 10. The semiconductor layer 12 is used for a TFT, an electrode, or wiring. In the illustrated configuration, the semiconductor layer 12 forms a source region, a channel region, and a drain region of a driver TFT 14. The semiconductor layer 12 of the driver TFT 14 is covered with a gate insulating film 16 and a gate electrode 18 is formed above the gate insulating film 16 and above the channel region of the semiconductor layer 12. In addition, an interlayer insulating film 20 is formed over the entire surface covering the gate electrode 18 and the gate insulating film 16.

A source electrode 22 is connected to the source region of the driver TFT 14 through the interlayer insulating film and a planarizing film 24 is formed covering the source electrode 22 and the interlayer insulating film 20.

A transparent electrode 26 having a size corresponding to a display area of a pixel is formed over the planarizing film 24 and is connected to the drain region of the driver TFT 14 through a contact hole.

The periphery of the transparent electrode 26 is covered by a second planarizing film 28 and an EL element 30 is formed above the transparent electrode 26.

The EL element 30 is an organic EL element with a layered structure having an organic layer (emissive element layer) 34 of at least an organic compound, in particular, an organic light emitting material, between the transparent electrode 26 and an opposing electrode 32. Holes are injected from an anode into the organic layer 34 and electrons are injected from a cathode into the organic layer 34. The injected holes and electrons recombine in the organic layer, the organic light emitting material is excited with the energy resulting from the recombination, and light is emitted when the organic light emitting material returns to the ground state.

The transparent electrode 26 is formed of a conductive metal oxide material such as, for example, ITO (Indium Tin Oxide) and IZO (Indium Zinc Oxide) and the opposing electrode 32 is formed of Al or an alloy of Al which functions as an upper reflective film. In addition, a lower reflective film 36 is provided below the transparent electrode 26 to form a micro-resonator (microcavity) structure between the upper and lower reflective films.

The illustrated structure is a bottom emission type display device in which the light obtained in the organic layer 34 is transmitted through the side of the transparent electrode 26 and through the substrate 10, and emitted to the outside. The lower reflective film 36 in this structure is formed as a semi-transmissive film which can transmit a portion of the light from the organic layer 34. As a material for the lower reflective film 36, it is possible to use anyone of Ag, Au, Pt, Al or an alloy film thereof. The lower reflective film 36 is formed as a thin film having a thickness to allow light to transmit through or in a pattern having an opening such as a mesh pattern or a grid pattern. The preferred invention is not limited to a bottom emission type display device and may also be applied to a top emission type display device in which light is emitted to the outside from above the element. When a top emission type structure is employed, it is possible to set the lower reflective film 36 to be reflective rather than semi-transmissive and the opposing electrode 32 to be semi-transmissive. The semi-transmissive opposing electrode 32 can be realized by, for example, forming, on a side of the opposing electrode facing the emissive element layer, a thin film of Ag, Au, or the like or a semi-transmissive film having a pattern with an opening such as a mesh-shaped semi-transmissive film and layering a transparent electrode such as ITO on the thin film or semi-transmissive film.

The organic layer 34 includes an emissive layer having at least organic light emitting molecules, and may be formed as a layered structure of a single layer, two layers, three layers, or four layers or more depending on the material(s). In the configuration illustrated in FIG. 1, a hole injection layer 122, a hole transport layer 124, an emissive layer 126, an electron transport layer 128, and an electron injection layer 130 are formed through successive film formation of vacuum evaporation, etc., in this order from the side of the transparent electrode 26 which functions as the anode. The opposing electrode which functions as the cathode in this configuration is formed over the electron injection layer 130 through vacuum evaporation similar to that for the organic layer 34. The electron injection layer 130 may also be considered as a part of the opposing electrode 32.

The microcavity structure of the preferred embodiment is formed in a region in which the transparent electrode 26 and the opposing electrode 32 oppose each other with the organic layer 34 therebetween, that is, between the lower reflective film 36 below the transparent electrode 26 and the opposing electrode 32 which also functions as the upper reflective film. Here, an optical length (optical distance) L of the microcavity is represented by:

$$L = \Sigma n_i d_i \quad (1)$$

which is a sum of products of $n_i$ and $d_i$, wherein d represents a thickness of each layer formed between the lower reflective film 36 and the opposing electrode 32 (upper reflective film), n represents the index of refraction of the same layer, and i represents a number of layering and is an integer of 1–i. In addition, the optical length L satisfies a relationship with respect to a light emission wavelength λ as will be represented by equation (3). By setting the optical length according to this relationship, it is possible to selectively intensify light of a wavelength λ and emit the light to the outside.

A full color organic EL panel typically has separate pixels for 3 colors of R, G, and B. A predetermined optical length L ($L_r$, $L_g$, and $L_b$) corresponding to wavelengths λ of R, G, and B ($\lambda_r$, $\lambda_g$, and $\lambda_b$) is set in each of the R, G, and B pixels. In this structure, a metal material is used for the lower reflective film 36 and for the opposing electrode 32, and phase shifts when light is reflected by these films are represented by Φ in the equation (3) to be described later.

In the present embodiment, a thickness of the transparent electrode 26 varies within a pixel. As shown in FIG. 1, the thickness of the transparent electrode 26 is greater on the left side than that on the right side. Therefore, the optical length L1 of the left portion is greater than the optical length L2 of the right portion (that is, L1>L2) and two microcavities are set within each pixel.

Figure 2:
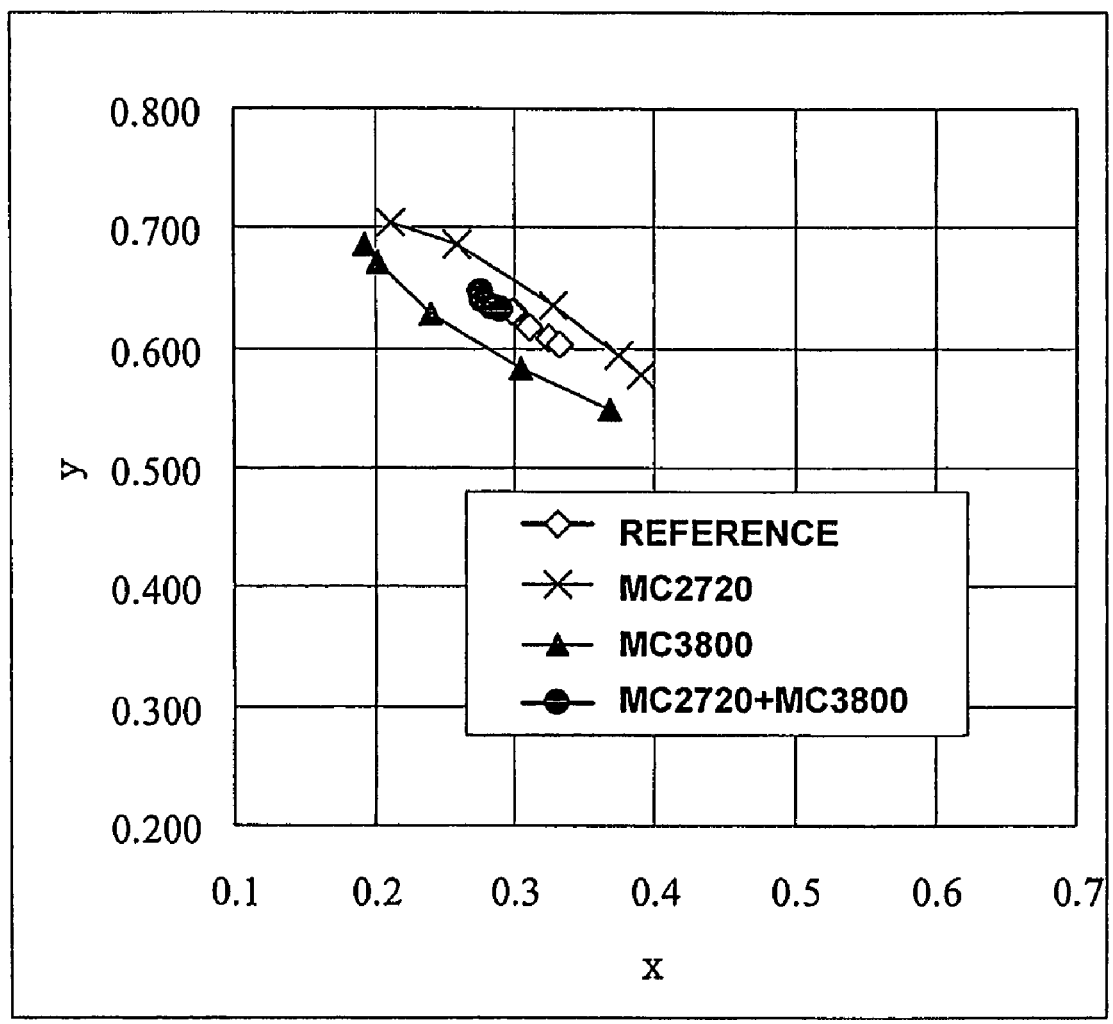
FIG. 2 is a diagram showing a viewing angle dependency.

FIG. 2 shows a viewing angle dependency in EL elements which emit green, with the cavity length D of the microcavity being (i) 2720 Å ("MC=2720"), (ii) 3800 Å ("MC=3800"), (iii) 0 or no microcavity (reference), and (iv) 2720 Å and 3800 Å ("MC=2720+MC=3800"; two microcavities are distributed in an area ratio of 1:1). FIG. 2 shows a chromaticity diagram (Yxy) in a CIE color specification system. The cavity length D in this description is an effective thickness (total thickness) between the reflective film and semi-reflective film for achieving the above-described optical length L for resonating light of a predetermined wavelength and is represented by the following equation (2).

$$D = \Sigma d_i \qquad (2)$$

The configuration of "MC=2720" is illustrated in FIG. 2 with "X" marks and has a resonance wavelength of 570 nm at a viewing angle of 0° which is a color with a chromaticity indicated at the lower right (x=0.39, y=0.58). As the viewing angle is increased, the resonance wavelength is shifted toward the shorter wavelength side (direction toward upper left of FIG. 2). At a viewing angle of 60°, this configuration has a resonance wavelength of 520 nm in which green color with a high color purity can be obtained and which is represented at upper left in FIG. 2 (x=0.21, y=0.71).

The configuration of "MC=3800" is represented by black triangles and has a resonance wavelength of 510 nm at a viewing angle of 0° which is a green color with a high color purity on upper left (x=0.19, y=0.69) in FIG. 2. As the viewing angle is increased, the resonance wavelength is shifted toward a shorter wavelength side (direction toward lower right of FIG. 2). At a viewing angle of 60°, the configuration is positioned at a lower left position (y=0.37, y=0.55). A light emission spectrum resulting from an organic light emitting material used in this element has a peak at green, and because there is no blue component, when the resonance wavelength is shifted as the viewing angle increases the resonance wavelength component within the original light emission spectrum is small and the light emission intensity of the element is reduced, resulting in semi-transmissive light of green. The configuration of "reference" is represented by diamonds in FIG. 2 and the ranges of movement are approximately x=0.30~0.33 and y=0.60~0.63. Thus, the viewing angle dependency is relatively small. In the configuration of "MC=2720+MC=3800" which is the configuration according to the present embodiment, the viewing angle dependency is smaller compared to the cases where only one type of cavity condition is set. In other words, because the configuration of "MC=2720+MC=3800" can achieve a high color purity of MC3800 Å at the viewing angle of 0° and of MC2720 Å at the viewing angle of 60°, it is possible to always maintain a high color purity at any viewing angle. Therefore, in an element with a combination of a plurality of regions with different cavity lengths, the ranges of movement of the chromaticity are approximately x=0.27~0.29 and y=0.63~0.65, which represent positions on the chromaticity diagram above and to the left of the positions for the reference, with a smaller color shift and improved color purity.

As described, with the structure of the present embodiment, microcavities having two thickness, 2720 Å and 3800 Å, are formed in a pixel (with a step of approximately 1100 Å) to significantly improve (reduce) the viewing angle dependency for green color.

The resonance condition and the dependency on angle (viewing angle) of the resonance wavelength can be represented by the following equation (3):

$$\frac{2L\cos\Theta'}{\lambda'} + \frac{\phi}{2\pi} = m (m: \text{integer}) \qquad (3)$$

$$\Theta' = \sin^{-1}\{(\sin\Theta)/n\}$$

$$\lambda' = \lambda + (\cos\Theta - 1)\lambda$$

wherein L represents the optical length L ($=\Sigma n_i d_i$) as described above, $\Phi$ is a constant representing a phase shift which occurs in the reflection by the metal, and $\theta$ represents an angle (viewing angle).

Figure 3:
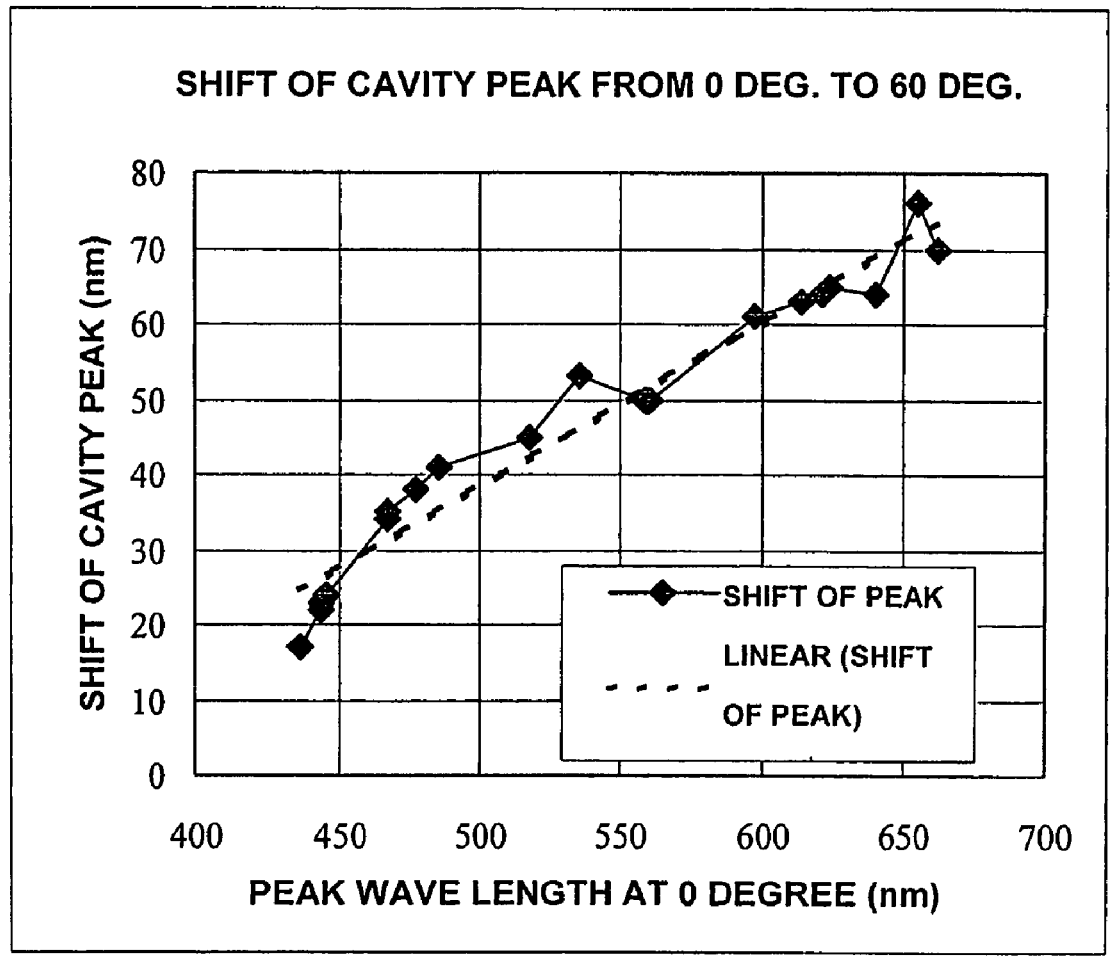
FIG. 3 is a diagram showing a relationship between a wavelength of light and an amount of shift in a peak wavelength at a viewing angle of 60°.

FIG. 3 shows a relationship between an amount of shift of the peak wavelength toward the shorter wavelength side at the viewing angle of 60° with respect to a peak wavelength at the viewing angle of 0°, the amount of shift being shown along the y axis and the peak wavelength at the viewing angle of 0° being shown along the x axis. A configuration with a cavity length of 4500 Å~5500 Å is illustrated. As shown, with a peak wavelength of approximately 450 nm at 0°, the amount of shift of the wavelength when the viewing angle is increased to 60° is approximately 28 nm. In another configuration having a peak wavelength of approximately 600 nm at 0°, the amount of shift of wavelength at the viewing angle of 60° is approximately 60 nm.

In this manner, a waveform having a peak of 600 nm at the viewing angle of 0° is shifted by 60 nm toward the shorter wavelength side at a viewing angle direction of 60° and becomes a waveform having a peak of 540 nm. Therefore, in the green pixel of 550 nm, a microcavity having a cavity length D of 600 nm~700 nm (a cavity length D which resonates wavelength of 600 nm~700 nm) is provided. The step is approximately 1000 Å (100 nm)~1300 Å (130 nm) by substituting m=1 in the above-described equation.

The configurations of "MC=2720" and "MC=3800" have resonance wavelengths of light of 570 nm (m=1) and 510 nm (m=2), respectively, at the viewing angle of 0°. In other words, in the above-described configuration, in order to form microcavities having a low viewing angle dependency and corresponding to green, microcavities with cavity lengths D having resonance peaks of 510 nm and 570 nm when the viewing angle is 0° are combined within a pixel.

In the pixel of red having a wavelength of 630 nm, it is preferable to incorporate a microcavity having a cavity length D of approximately 700 nm to 800 nm, with the step being approximately 1600 Å when m=0. In the pixel of blue having a wavelength of 450 nm, it is preferable to incorporate a microcavity having a cavity length of approximately 480 nm to 580 nm, with the step being approximately 1000 Å when m=0.

The value for the step differs with different values for m. In consideration of step coverage, however, it is preferable that the step be 2000 Å or less. In other words, when regions of different cavity lengths within a pixel are defined as a first region (for example, MC3800 Å in the above-described configuration) and a second region (for example, MC2720 Å in the above-described configuration), it is preferable to determined the cavity length D of the first region and the cavity length D of the second region considering the target resonance wavelength, original light emission spectrum, filter characteristics when a color filter is combined and used, or the like, but the difference (step) between the cavity lengths is preferably within 200 nm (2000 Å). By setting the cavity lengths in this range, even when first and second regions are formed by varying the thickness of the transparent electrode as described above, for example, it is possible to prevent disconnection of a line above the electrode due to the step formed in the transparent electrode. For example, the thickness of the electron transport layer is typically set to a thickness of less than 3000 Å because the drive voltage must be increased when the thickness of the electron transport layer is increased and such an increase in the drive voltage is disadvantageous. Therefore, in order to prevent disconnection of the electron transport layer by the step, it is preferable that the step is formed to 200 nm or less.

In this manner, by setting a plurality of cavity lengths D in a region of a pixel for obtaining a certain color, it is possible to improve the viewing angle dependency and improve color purity. Here, the plurality of cavity lengths D to be selected are set, for example, such that the cavity length D of the first region corresponds to a thickness in which the original target resonance wavelength coincides with the peak wavelength at a viewing angle of 0°, and the cavity length D of the second region, which differs from the cavity length D of the first region, corresponds to a thickness in which the target resonance wavelength coincides with the peak wavelength at another viewing angle (for example, 60°). In the above description, two regions with different cavity lengths are formed in each pixel, but the number of regions is not limited to two, and may be extended to three or more as necessary.

In the preferred embodiment described above, an RGB separation configuration is utilized in which the materials of emissive layers are individually set such that the light emission wavelengths of the pixels become one of R, G, and B. There also is another configuration in which the emissive layer itself emits light of white color and the emission colors are set using color filters. In this configuration also, it is possible to consider intensifying light of each color by selecting the resonance wavelength of the microcavity. An emissive layer which emits white light can be formed as a common layer for a plurality of pixels.

Figure 4:
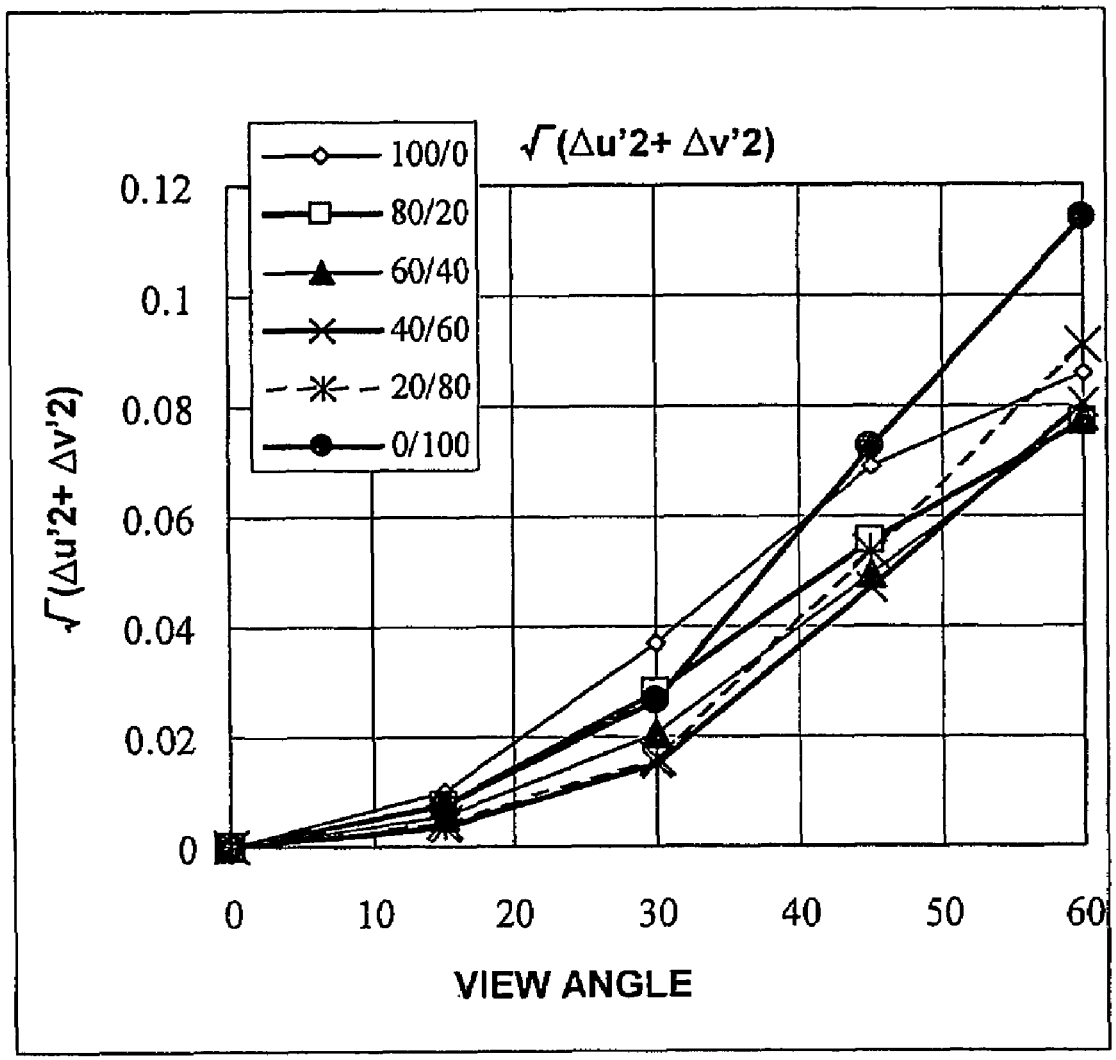
FIG. 4 is a diagram showing a relationship between a viewing angle and an amount of shift.

FIG. 4 shows a change in chromaticity when the area ratio between the portions having different cavity lengths D is changed in a pixel structure of white color+color filter (green) with cavity lengths D of the microcavities being CL1=2600 Å (corresponding to a target resonance wavelength of 560 nm) and CL2=3000 Å (corresponding to an auxiliary resonance wavelength of 600 nm) and a step of 400 Å. In this illustrated structure, m=2. Δu' and Δv' represent amounts of change of u' and v' in the CIELUV color specification system, the x-axis represents the viewing angle, and the y-axis represents an amount of change of color (a sum of squares of Δu' and Δv', that is, $\sqrt{(\Delta u'^2 + \Delta v'^2)}$).

From this result, it can be seen that the area ratio CL1/CL2 of 80/20 to 60/40 achieves the minimum amount of change of color and superior characteristics. The optimum area ratio can be changed based on the light emission spectrum. When the color of the color filter to be combined with the white color element is different, the area ratio can be set to the optimum area ratio corresponding to this color (including the characteristics of the color filter). It is also desirable that the area be set to an optimum area corresponding to the EL material(s) to be used, that is, the spectrum of the white color light. Moreover, it is also possible to optimize the area corresponding to the target resonance wavelength.

Figure 5:
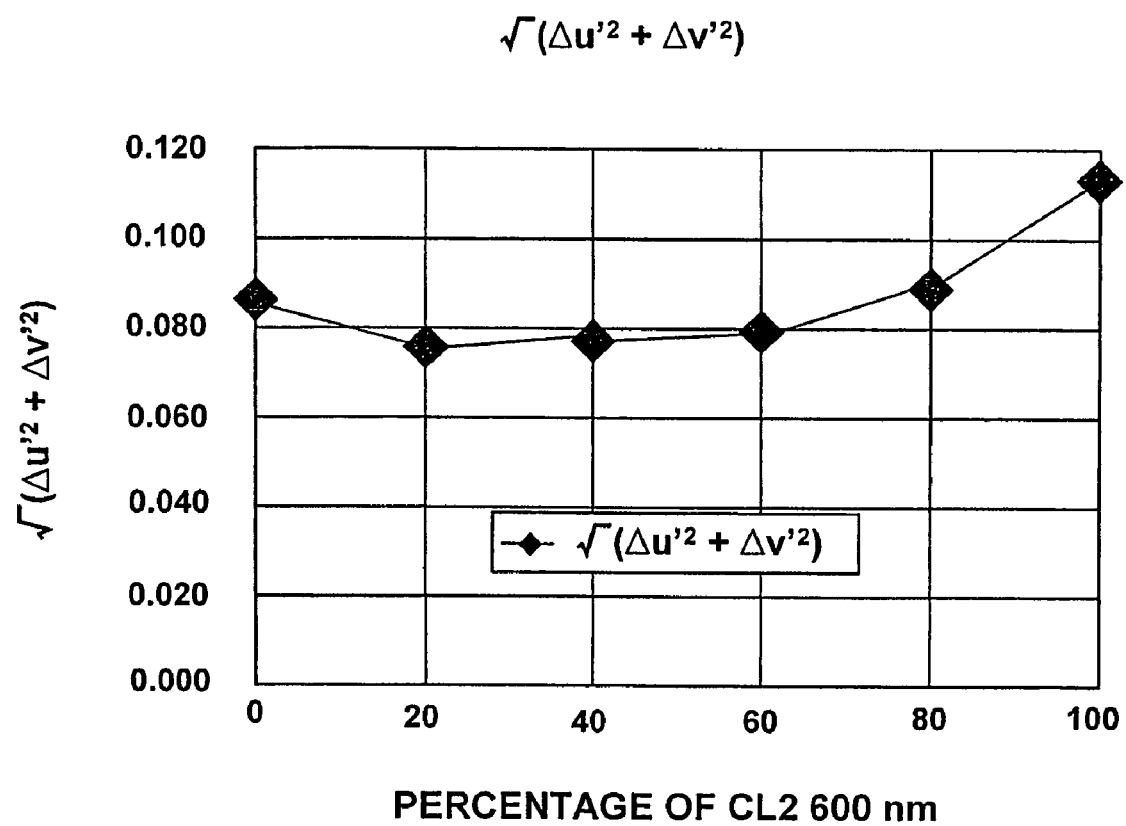
FIG. 5 is a diagram showing a relationship between an area ratio and a color change.

FIG. 5 shows a relationship between a percentage of CL2 within a pixel for obtaining an auxiliary resonance wavelength of 600 nm and an amount of change of color, regarding the amount of change of color at each area ratio shown in FIG. 4. Here, it is preferable that the value of $\sqrt{(\Delta u'^2 + \Delta v'^2)}$ is 0.08 or smaller. From FIG. 5, it can be seen that the range of the area of CL2 may preferably be set to 10% to 60%. In other words, when the regions of different cavity lengths within a pixel are defined as a first region (for example, CL1) and a second region (for example, CL2), it is preferable to set the area, within the pixel, of the second region having an auxiliary resonance wavelength which is longer than a target resonance wavelength of the first region, within a range of 10%~60%. As can be understood from FIG. 4, when the viewing angle is less than 60°, for example, when the viewing angle is less than 55°, even when the area of the second region CL2 within a pixel is less than 20%, the value for $\sqrt{(\Delta u'^2 + \Delta v'^2)}$ is 0.08 or smaller as long as the area of the second region CL2 is greater than 0%, and, thus, the change of color can be inhibited. Therefore, it is possible to effectively realize an element with a small change of color by setting the area of the second region within a pixel, for example, in a range of 1%~60%.

In the present embodiment, the lengths of the microcavities are changed by varying the thickness of the transparent electrode 26. In order to realize this structure, it is possible to apply a two-step deposition process in a formation process of the transparent electrode 26. Specifically, it is possible to provide a step of depositing a material of the electrode at both the thin portion (for example, the first region) and the thick portion (for example, the second region) and a step of depositing the material of the electrode only at the thick portion. These steps may be performed in any order.

Figure 7:
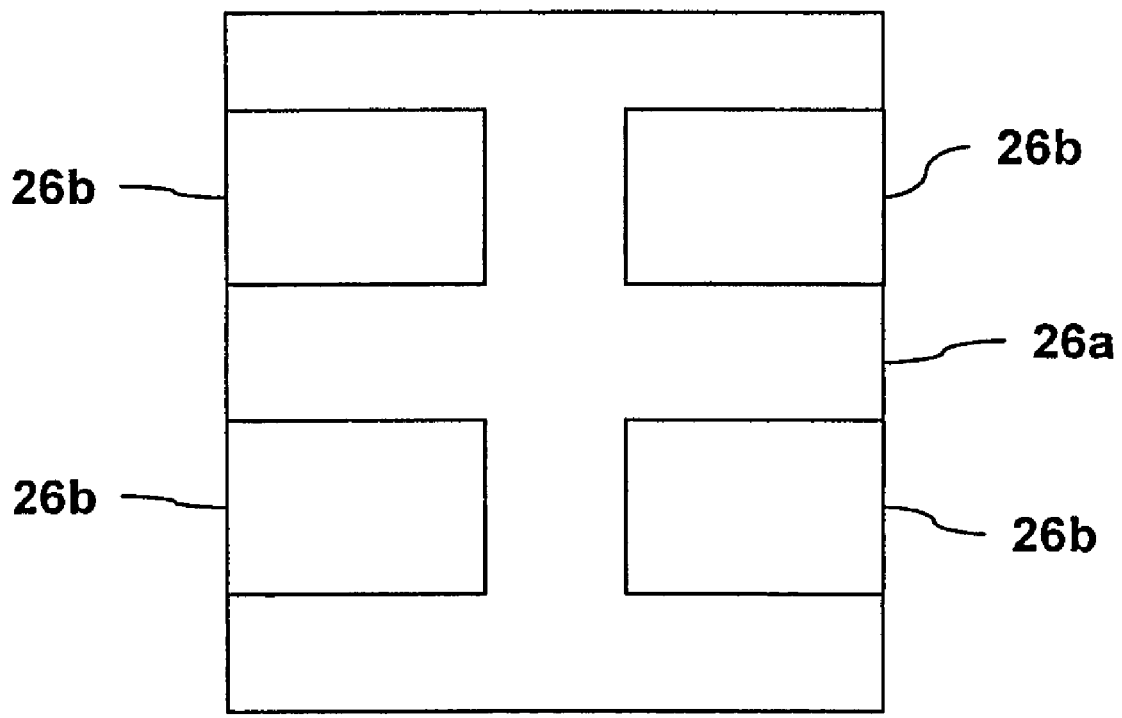
FIG. 7 is a diagram showing a planar structure of the thickness change of FIG. 6.

For example, as shown in FIG. 6, the transparent electrode may be formed through two separate depositions including a first deposition of a transparent electrode 26a (through, for example, sputtering or vacuum evaporation) over the entire surface and a second deposition of a transparent electrode 26b only over the thick potion. In this case, as shown in FIG. 7, it is preferable that the thick portion (the portion to which the transparent electrode 26b is to be deposited) be formed like an island in which the portion is divided into a plurality of smaller divisions. By providing the thick portion distributed over the pixel, it is possible to achieve relatively uniform display in the pixel as a whole. It is also preferable to set the area of each divided division to ¼ (25%) or less of the area of the pixel, in addition to forming the second region for achieving an auxiliary resonance wavelength (on the side of longer wavelength than the target resonance wavelength) in a divided and distributed manner within the pixel with respect to the first region for realizing the target resonance wavelength at the viewing angle of 0°. With the area of each of the divided regions being 25% or less, even when regions of different resonance wavelengths exist within the pixel, it is difficult to visually recognize these regions while the degradation of display quality can be prevented.

Figure 8:
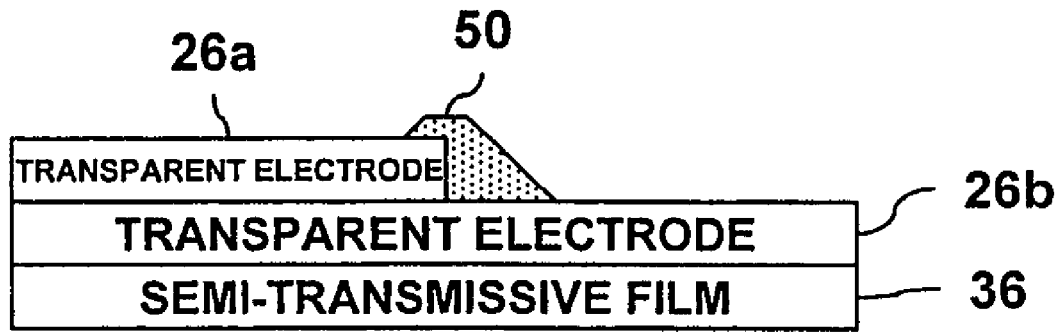
FIG. 8 is a diagram showing an example configuration in which an insulating layer for resolving a step is added to the example configuration of FIG. 6.

It is also desirable to employ a structure as shown in FIG. 8 in which an insulating layer 50 is formed covering the step portion formed by the transparent electrode portions 26a and 26b. By providing the insulating layer 50, it is possible to planarize the step portion and to prevent destruction of layers to be formed above the transparent electrode and disconnection in the cathode.

Figure 9:
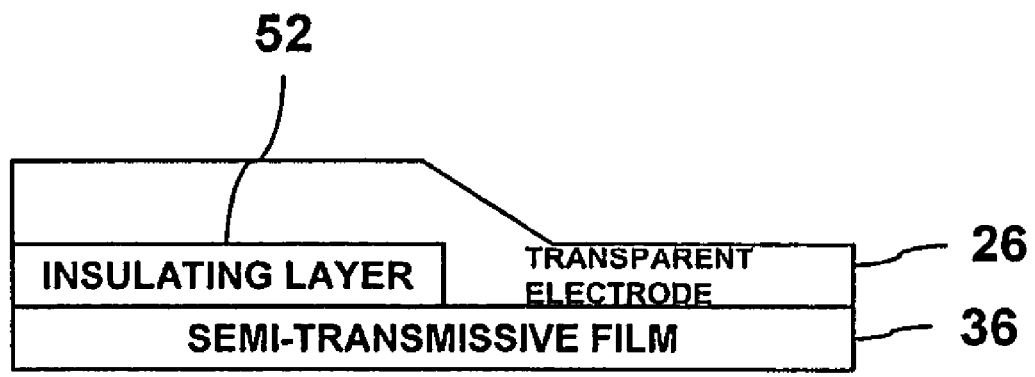
FIG. 9 is a diagram showing an example configuration in which the thickness is varied with a transparent insulating layer.

It is also desirable, as shown in FIG. 9, to provide a transparent insulating layer (for example, SiN) 52 between the semi-transmissive film 36 and the transparent electrode 26 in regions of longer cavity length D. With this configuration, the cavity length D can be increased by an amount corresponding to the insulating layer 52. In this case, by using a low taper material as the insulating layer 52, it is possible to prevent disconnection.

As described, according to the present embodiment, the cavity lengths D of microcavities vary within a pixel. Therefore, when the viewing angle changes, the wavelength of light to be intensified would differ depending on the location, and thus, it is possible to compensate for a shift in color in the case of a single cavity length D and to reduce viewing angle dependency of color.

In the description above, the thickness of the transparent electrode 26 is changed in order to vary the cavity length D within a pixel region. The present invention, however, is not limited to this configuration and the cavity length D may alternatively be varied, for example, by changing, within a pixel region, the thickness of the emissive element layer 34 in the structure of FIG. 1.

When a plurality of regions having different cavity lengths are to be provided within a pixel region, percentages of the regions (area ratio) may be common to all pixels even when light emission wavelengths (that is, the light entering the microcavity) assigned to the pixels differ from each other. However, because the resonance conditions differ depending on the original light emission wavelength of the organic EL element, it is desirable to optimize the area ratio for each color (each wavelength), that is, for each pixel of different color to achieve a suitable percentage for reducing the viewing angle dependency in all colors. Therefore, when pixels of three colors of R, G, and B exist, the area ratio between the first region and the second region for pixels of at least one color of R, G, and B differs from the area ratio between the first region and the second region for pixels of another color. When, on the other hand, pixels of four colors of R, G, B, and W exist, an area ratio which differs from that for pixels of another color is assigned to one of the four colors. This variation in area ratio among colors is preferable, for example, both in a display device for achieving a color display by separately providing emissive materials for each of R, G, and B pixels and in a display device for achieving a color display using a white color emissive element in all pixels and color filters. Because the cavity lengths D of the first and second regions may differ depending on the color, the resonance mode (value of m), waveform of the original light emission spectrum, or the like in addition to the area ratio, it is desirable to adjust the cavity length D based on various conditions to be used.

The area ratio between the first region and the second region, that is, between the first region in which a target resonance wavelength is obtained at a viewing angle of 0° (front face) and the second region in which an auxiliary resonance wavelength is obtained (a region in which a target resonance wavelength is realized at another viewing angle) may be changed based on the position of the pixel on the display panel, in addition to the change of area ratio based on the emission color or the like. For example, when the central position on the panel is determined as a normal observation position viewed at the viewing angle of 0°, the normal viewing angle with respect to a peripheral region of the panel would differ from 0°. Therefore, it is desirable that the percentages of areas of the first and second regions within each pixel be changed in consideration of the position on the panel, that is, the difference in the viewing angle from the normal observation position. Even for pixels of the same color, the cavity lengths D of the first and second regions may be adjusted corresponding to the position of the pixels on the panel. When the size of the panel is increased, the difference in viewing angle between a central position and a peripheral position on the panel also increases. Therefore, the adjustment based on the position on the panel is effective when the size of the display device is increased.

Figure 10:
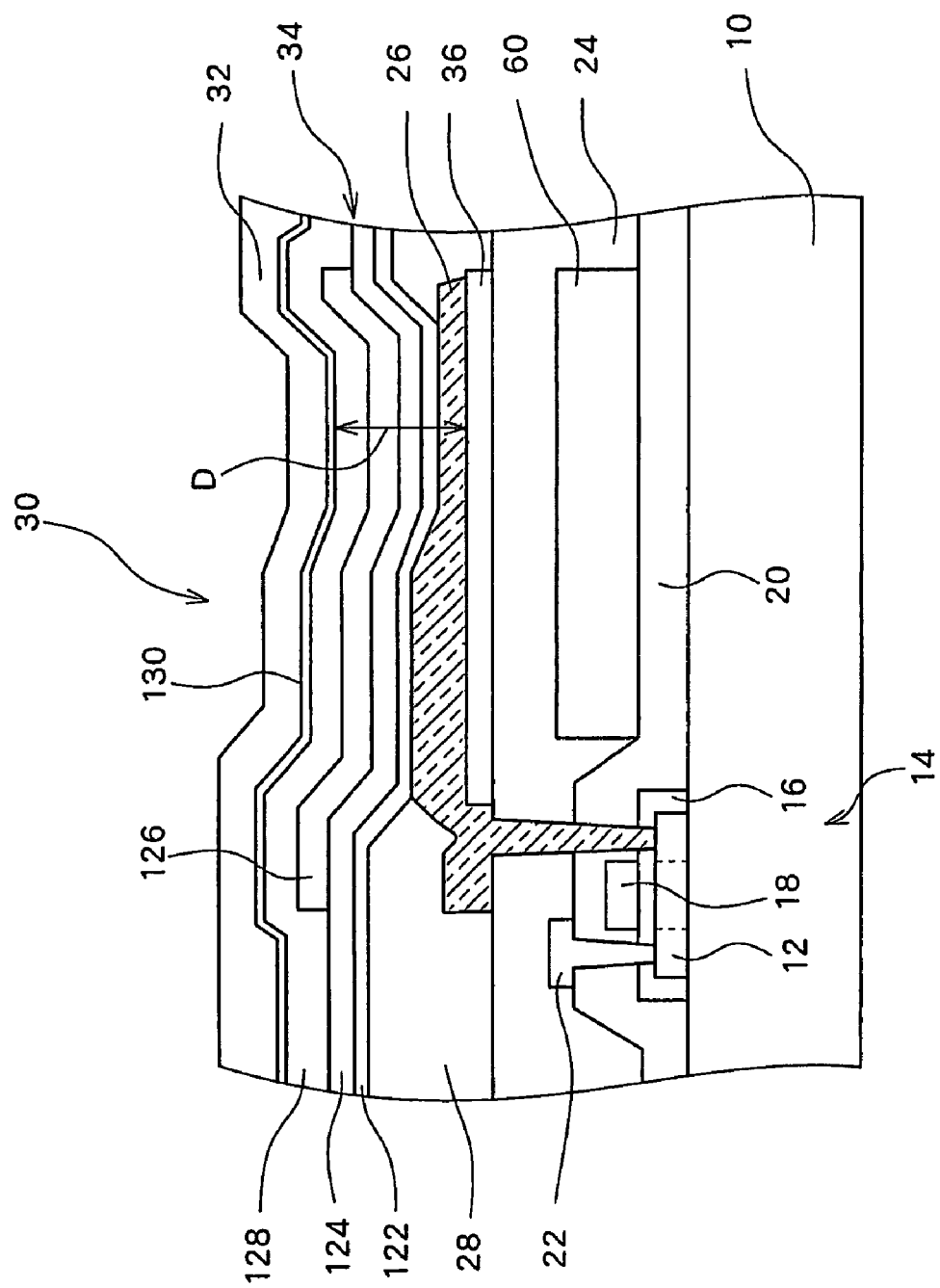
FIG. 10 is a diagram showing a structure of an important portion of the pixel when a color filter is provided in each pixel.

In the present embodiment, in a device in which separate R, G, and B emissive materials are used for pixels of different colors, a plurality of regions having different cavity lengths are provided in each pixel as described above. In addition to this structure, it is also possible to provide a color filter in each pixel. The color filter 60 may be provided, for example, between the interlayer insulating film 20 and the planarizing film 24 as shown in FIG. 10 or between the planarizing film 24 and the semi-transmissive film 36.

Figure 11:
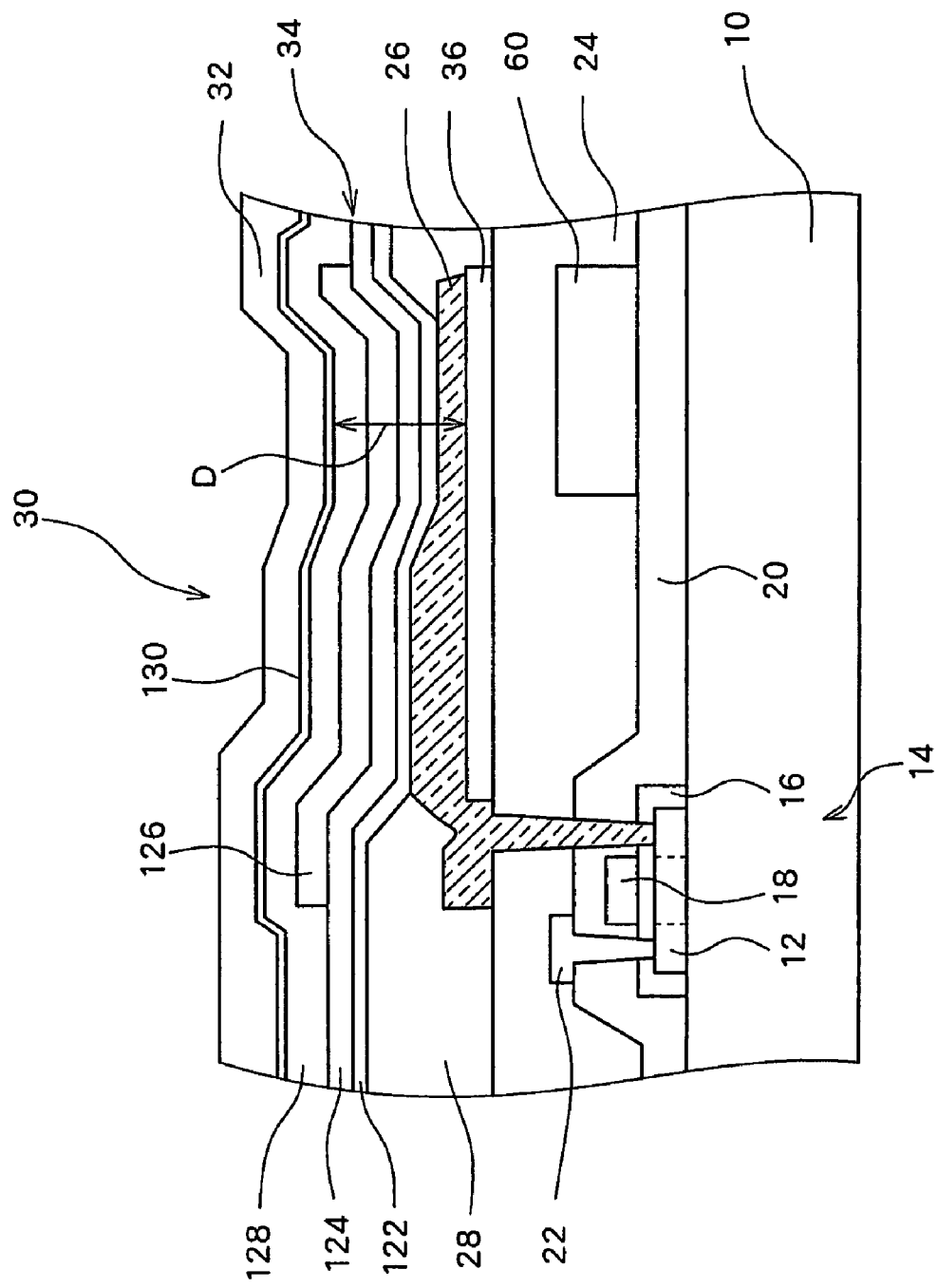
FIG. 11 is a diagram showing a structure of an important portion of the pixel when a color filter is provided in a partial region of each pixel.

In the device of separate provision, no color filter is necessary. However, because regions of different cavity lengths exist within a pixel region, even when an optimum resonance wavelength is obtained in the first region at a viewing angle is 0°, for example, light having a wavelength which is not optimum may be intensified and emitted in the second region. Therefore, in a structure described above for a green EL element, for example, by providing a green color filter in addition to forming a plurality of cavities in the element to allow only light in a desired wavelength band to transmit, it is possible to obtain green light with higher color purity at any viewing angle. In this configuration, the color filter 60 may be formed over the entire pixel region, or, alternatively, only over the region corresponding to any one of regions of different cavity lengths (for example, the second region in the above-described configuration) as shown in FIG. 11.

What is claimed is:

1. An electroluminescence panel having an electroluminescence element in each pixel,
   wherein the electroluminescence element in each pixel has a layered structure with an emissive element layer having at least a light emitting function provided between a reflective film and a semi-transmissive film which opposes the reflective film, the electroluminescence element having a microcavity in which a cavity length which is a distance between the reflective film and the semi-transmissive film is set to intensify light of a predetermined wavelength,
   each pixel, which is a minimum unit of light emission, has portions having different cavity lengths,
   the electroluminescence element has an emissive element layer between a transparent electrode and a metal electrode,
   a semi-transmissive film is provided external to the transparent electrode,
   the metal electrode functions as a reflective film,
   the microcavity comprises the transparent electrode and the emissive element layer,
   a thickness of the transparent electrode is varied within each pixel to provide the portions having different cavity lengths, and
   an insulating layer is provided covering a step portion, of the transparent electrode, in which the thickness is varied.

2. An electroluminescence panel having an electroluminescence element in each pixel,
   wherein the electroluminescence element in each pixel has a layered structure with an emissive element layer having at least a light emitting function provided between a reflective film and a semi-transmissive film which opposes the reflective film, the electroluminescence element having a microcavity in which a cavity length which is a distance between the reflective film and the semi-transmissive film is set to intensify light of a predetermined wavelength,
   each pixel, which is a minimum unit of light emission, has portions having different cavity lengths,
   the electroluminescence element has an emissive element layer between a transparent electrode and a metal electrode,
   a semi-transmissive film is provided external to the transparent electrode,
   the metal electrode functions as a reflective film,
   the microcavity comprises the transparent electrode and the emissive element layer, and
   a transparent insulating layer is partially provided between the semi-transmissive film and the transparent electrode within one pixel to form the portions having different cavity lengths.

3. An electroluminescence panel having an electroluminescence element in each pixel,
   wherein the electroluminescence element in each pixel has a layered structure with an emissive element layer having at least a light emitting function provided between a reflective film and a semi-transmissive film which opposes the reflective film, the electroluminescence element having a microcavity in which a cavity length which is a distance between the reflective film and the semi-transmissive film is set to intensify light of a predetermined wavelength, each pixel, which is a minimum unit of light emission, has portions having different cavity lengths, each pixel comprises at least two regions including a first region and a second region having different cavity lengths, a resonance wavelength which is a wavelength of light to be intensified in the second region is longer than the resonance wavelength of the first region, and an area of the second region within a pixel is 10% to 60% of the area of the pixel.

4. An electroluminescence panel having an electroluminescence element in each pixel, wherein the electroluminescence element in each pixel has a layered structure with an emissive element layer having at least a light emitting function provided between a reflective film and a semi-transmissive film which opposes the reflective film, the electroluminescence element having a microcavity in which a cavity length which is a distance between the reflective film and the semi-transmissive film is set to intensify light of a predetermined wavelength, each pixel, which is a minimum unit of light emission, has portions having different cavity lengths, a plurality of pixels corresponding to different colors are formed on the panel, each pixel of at least pixels corresponding to one color comprises a first region and a second region having different cavity lengths within the pixel, a resonance wavelength which is a wavelength of light to be intensified in the second region is longer than the resonance wavelength of the first region, and a percentage of the area of the second region within a pixel differs from a percentage of the area of the second region within a pixel of a different color.

5. An electroluminescence panel having an electroluminescence element in each pixel, wherein the electroluminescence element in each pixel has a layered structure with an emissive element layer having at least a light emitting function provided between a reflective film and a semi-transmissive film which opposes the reflective film, the electroluminescence element having a microcavity in which a cavity length which is a distance between the reflective film and the semi-transmissive film is set to intensify light of a predetermined wavelength, each pixel, which is a minimum unit of light emission, has portions having different cavity lengths, and each pixel comprises a corresponding color filter.

6. An electroluminescence panel according to claim 5, wherein the electroluminescence element of each pixel comprises an emissive element layer having a light emission function of color assigned to each pixel.

7. An electroluminescence panel according to claim 5, wherein the electroluminescence element of each pixel comprises an emissive element layer having a light emitting function of common color for each pixel.

8. An electroluminescence panel having an electroluminescence element in each pixel, wherein the electroluminescence element in each pixel has a layered structure with an emissive element layer having at least a light emitting function provided between a reflective film and a semi-transmissive film which opposes the reflective film, the electroluminescence element having a microcavity in which a cavity length which is a distance between the reflective film and the semi-transmissive film is set to intensify light of a predetermined wavelength, each pixel, which is a minimum unit of light emission, has portions having different cavity lengths, each pixel comprises at least two regions including a first region and a second region having different cavity lengths, and a color filter assigned to each pixel is formed in only one of the first region and the second region.

* * * * *